(12) United States Patent
Tanaka

(10) Patent No.: US 8,232,982 B2
(45) Date of Patent: *Jul. 31, 2012

(54) DRIVING METHOD OF AN ELECTRIC CIRCUIT

(75) Inventor: Yukio Tanaka, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 892 days.

This patent is subject to a terminal disclaimer.

(21) Appl. No.: 12/061,201

(22) Filed: Apr. 2, 2008

(65) Prior Publication Data

US 2008/0191988 A1 Aug. 14, 2008

Related U.S. Application Data

(63) Continuation of application No. 11/275,905, filed on Feb. 2, 2006, now Pat. No. 7,358,763, which is a continuation of application No. 09/906,617, filed on Jul. 18, 2001, now Pat. No. 7,164,414.

(30) Foreign Application Priority Data

Jul. 31, 2000 (JP) ................................. 2000-232450

(51) Int. Cl.
*G09G 5/00* (2006.01)
(52) U.S. Cl. .............. 345/204; 345/90; 345/92; 345/98; 345/100
(58) Field of Classification Search ............... 345/87, 345/90, 92, 95, 98, 100, 204; 326/38, 46, 326/82, 83, 93
See application file for complete search history.

(56) References Cited

U.S. PATENT DOCUMENTS

| 4,980,583 | A |   | 12/1990 | Dietz |
|---|---|---|---|---|
| 5,128,974 | A | * | 7/1992 | Maekawa ..................... 377/81 |
| 5,552,801 | A |   | 9/1996 | Furuhashi |
| 5,608,421 | A |   | 3/1997 | Okada |
| 5,646,644 | A |   | 7/1997 | Furuhashi |
| 5,818,406 | A |   | 10/1998 | Tsuchi |
| 5,889,709 | A |   | 3/1999 | Fukuda |
| 5,990,857 | A | * | 11/1999 | Kubota et al. ................ 345/98 |
| 6,225,866 | B1 |   | 5/2001 | Kubota et al. |
| 6,373,458 | B1 |   | 4/2002 | Yamakura et al. |
| 6,396,468 | B2 |   | 5/2002 | Matsushima |

(Continued)

FOREIGN PATENT DOCUMENTS

DE 4023981 2/1991

(Continued)

OTHER PUBLICATIONS

Yong-Min Ha; "48.3: *Invited Paper*: P-type Technology for Large Size Low Temperature Poly-Si TFT-LCDs"; *SID 00 Digest*; pp. 1116-1119; (2000).

(Continued)

*Primary Examiner* — Quan-Zhen Wang
*Assistant Examiner* — Jennifer Nguyen
(74) *Attorney, Agent, or Firm* — Fish & Richardson P.C.

(57) ABSTRACT

A variation in threshold may be suppressed by structuring an analog switch by a MOS transistor and forming a signal synchronized to a clock by making the clock which is a common signal in continuity or discontinuity. An object of the present invention is to reduce the variation in the signal synchronized to the clock by the variation in threshold of the MOS transistor in a circuit which is synchronized to the clock.

20 Claims, 14 Drawing Sheets

U.S. PATENT DOCUMENTS

| | | |
|---|---|---|
| 6,633,359 B1 | 10/2003 | Zhang |
| 6,664,906 B2 | 12/2003 | Volk |
| 6,909,417 B2 * | 6/2005 | Washio et al. ............. 345/98 |
| 7,358,763 B2 * | 4/2008 | Tanaka ..................... 326/38 |
| 2003/0174115 A1 | 9/2003 | Washio |

FOREIGN PATENT DOCUMENTS

| | | |
|---|---|---|
| JP | 06-052689 | 2/1994 |
| JP | 07-236148 | 9/1995 |
| JP | 08-006523 A | 1/1996 |
| JP | 08-160916 | 6/1996 |
| JP | 08-211854 A | 8/1996 |
| JP | 09-166771 | 6/1997 |
| JP | 10-039823 A | 2/1998 |
| JP | 11-003068 | 1/1999 |
| JP | 2000-181410 | 6/2000 |
| JP | 2000-200072 A | 7/2000 |
| JP | 2001-075543 | 3/2001 |
| KR | 2000-0019416 | 4/2000 |
| WO | 00-16303 | 3/2000 |

OTHER PUBLICATIONS

First Office Action of Patent Application No. 01124750.9 issued by Patent Office of the People's Republic of China dated Apr. 30, 2004.
European Search Report (Application No. 01118348.0); Oct. 14, 2004; 3 pages.

* cited by examiner

DRIVING METHOD OF AN ELECTRIC CIRCUIT

BACKGROUND OF THE INVENTION

1. Field of the Invention

The present invention relates to a structure of an electric circuit, more specifically, in a circuit where synchronization is necessary, to a technique for reducing the variation of shift (delay) with a synchronization signal occurring from the variation of the transistor characteristic.

2. Description of the Related Art

Generally an electric circuit which synchronizes by taking in data corresponding to a common signal and preparing calculation results is used, using the common signal such as a clock.

Note that, in an electric circuit, when the structure of the electric circuit is complicated, the operation of the entire electric circuit has to be executed at a certain rhythm, otherwise a shift occurs in the operation timing due to the difference of the processing period of times of each part, thus not operating satisfactorily. Therefore, in order to synchronize the entire electric circuit, a basic pulse is supplied commonly to the electric circuit. In this specification, the basic pulse is referred to as a common signal or a synchronizing signal. Typically there are as the common signal, a clock signal, a clock back signal, a trigger signal and the like. Note that, the clock back signal is a signal which is an opposite phase to a clock signal.

Note that, in this specification, a trigger signal refers to a signal which triggers a change in state. More specifically, an electric circuit such as a multivibrator does not have an ability to continue oscillation by itself. However, if an input pulse is input from the outside, an output pulse with a time width differing from that of the input pulse is output. Since such an input pulse has a trigger function to oscillate the output pulse, it is referred to as the trigger signal.

In the electric circuit, conventionally a common signal is input to the controlling electrode (gate terminal) of the transistor, and a signal synchronized with the common signal is formed by making use of the change in resistance between the input terminal and the output terminal of the transistor.

Note that, in this specification, the input terminal and the output terminal of the transistor refer to a source region and a drain region of the transistor. Namely, one of the source region and the drain region of the transistor is the input terminal, and the other is the output terminal.

However, there is a variation in the transistor characteristic, and due to this variation, a variation occurred in the signal which is to synchronize with the common signal.

As a method of structuring the electric circuit, there is known a method of using a CMOS by structuring a logic circuit combining an n-channel MOS transistor and a p-channel MOS transistor.

In a MOS transistor used in the CMOS, when a control electrode (gate terminal) voltage is at a threshold voltage or lower, a current hardly flows, and when it exceeds a threshold voltage, the current starts to increase. Therefore, the variation of the threshold voltage is a problem in that variation occurs in a signal which is to synchronize with the common signal.

As a specific example of the structure of the conventional electric circuit, FIG. 3 shows a circuit using an AND. The AND has two input terminals, and when there is an input of Hi to the two input terminals (when there is an input of the same voltage as the higher power source voltage), there is an output of Hi. A common signal is input to one of the two input terminals of the AND, and a control signal is input to the other.

Note that, in this specification, the control signal refers to a video signal, a start pulse or the like.

FIG. 4 shows an example of a circuit when the AND in FIG. 3 is structured by CMOS. Reference numerals 101, 102 and 103 indicate p-channel MOS transistors, and reference numerals 104, 105 and 106 indicate n-channel MOS transistors. Here, Vdd and Vss are power source supply lines, and Vdd>Vss is satisfied.

The electric circuit shown in FIG. 3 is input with a common signal, a control signal 1 and a control signal 2 shown in FIG. 5. Ideally, as shown in FIG. 5, it is preferable that output 1 is output only for the time the common signal and the control signal 1 are simultaneously Hi, and output 2 and output 3 are output only for the time the common signal and the control signal 2 are simultaneously Hi. In this way, a signal synchronized with the common signal may be formed.

In actuality, by passing the AND, signals such as the common signal and the control signal are delayed. If all the transistors have totally the same characteristics, the same delay occurs in all the AND. However, all the transistors do not have the same characteristics, and therefore delays and also variations occur (FIG. 7). Further, although not shown here, variations occur in the waveform such as the rise time and the fall time of the output signal.

FIG. 6 shows an example where variation occurs in the threshold voltage of the MOS transistor. Here, the axis of abscissa Vg indicates the voltage applied to the gate terminal, and the axis of ordinate log(Id) indicates the current flowing between the source region and the drain region of the transistor in a log display. If a constant voltage is applied between the source region and the drain region of the transistor, while a current flowing between the source region and the drain region is measured and the voltage applied to the gate terminal is changed, a current starts to flow from a certain voltage (threshold voltage).

By variation of the transistor characteristics due to the variation of the threshold voltage, variation of propagation delay and variation of waveform as shown in FIG. 7 may occur, and a variation occurs in the signal which is to synchronize with the clock.

The characteristics of the plurality of transistors of the electric circuit, differ respectively, and thus there is a variation in a threshold voltage of the plurality of transistors.

SUMMARY OF THE INVENTION

The present invention has been made in view of the above, and an object of the present invention is to solve problems caused by a variation of a threshold voltage of a transistor.

Further, it is an object of the present invention to reduce the variation of a plurality of signals when the plurality of signals are necessary which synchronize with the common signal.

The present inventors considered that one of the causes of the variation of the signal output from the transistor is due to turning ON and OFF the transistor by the common signal used for synchronization. Thus, a method was proposed in which different signals are used as the signal to be output to turn the transistor to an ON state or an OFF state, and common signals are put in continuity, thereby to form the synchronized signal.

Conventionally, the signal synchronizing with the common signal is formed by inputting a common signal to a control electrode (gate terminal) of the transistor, and making use of the change in resistance between an input electrode and an output electrode of the transistor. In the present invention, the common signal is input to one of the input terminal and the output terminal of the transistor.

A transistor illustrated as a switching element is shown in FIGS. 1 and 2. FIG. 1 indicates the conventional method where the common signal is connected to the control electrode (gate terminal) of the transistor. The signal to be synchronized is connected to one of the input terminal and the output terminal of the transistor, and is output corresponding to the timing of the common signal.

FIG. 2 shows a method of the present invention where the common signal is connected to one of the input terminal and the output terminal of the transistor. The signal to be synchronized is connected to the control electrode (gate terminal) of the transistor, the transistor is turned to an ON state by the signal to be synchronized, and a common signal is output in such a state. The transistor does not turn to an ON state due to the common signal, but the common signal is in continuity when the transistor is in an ON state. Thus, the transistor functions as a resistor in respect to the common signal, and is not easily influenced by a variation of the transistor.

In particular, the MOS transistor and the MIS transistor are effected by the threshold during the time until the transistor is turned ON. Thus, with the conventional method, the transistors were easily influenced by the variation of the threshold.

The MOS transistor and the MIS transistor are transistors of controlling the electric conductive characteristic in which an electric field due to a voltage applied to a control electrode (gate terminal) is effected in a channel portion which is a current path between a source terminal and a drain terminal, corresponding to the input and output terminals.

In a case where the common signal is effected by the parasitic capacitance and resistance of the wiring and the like so that the waveform is distorted, a signal as near as possible to the common signal may be obtained with this method. Further, when the driving capability of the next stage of the signal synchronized to the common signal was insufficient, conventionally a buffer circuit was structured using a plurality of inverters. However, since a common signal is passed through an analog switch, there is a merit that a buffer circuit becomes unnecessary. Note that, a plurality of common signals may exist in one electric circuit.

BRIEF DESCRIPTION OF THE DRAWINGS

In the accompanying drawings:

FIG. 3 shows an example of a conventional circuit using an AND;

PREFERRED EMBODIMENTS OF THE PRESENT INVENTION

A circuit for manufacturing a signal synchronized to a common signal by inputting a common signal into an input output terminal of a transistor is considered.

Figure 1:
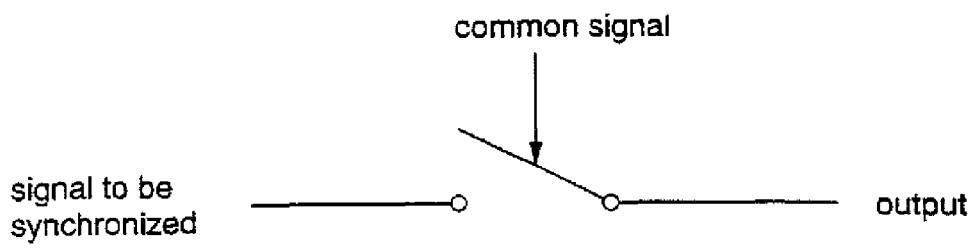
FIG. 1 shows a conventional structure with a transistor as a switching element.
Figure 2:
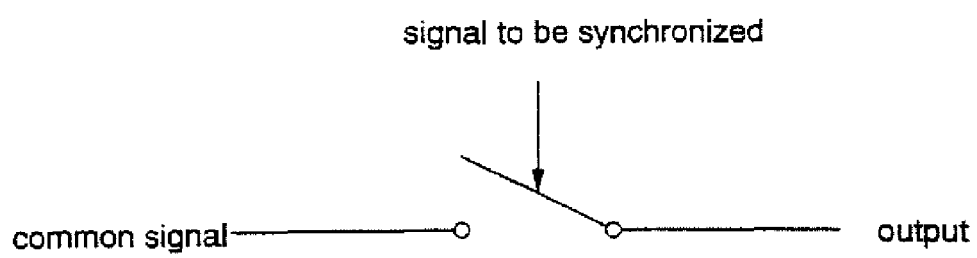
FIG. 2 shows a structure of the present invention with a transistor as a switching element.
Figure 3:
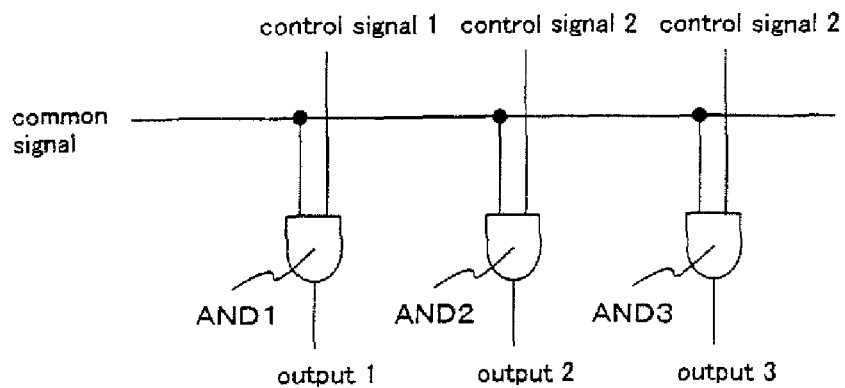
Figure 4:
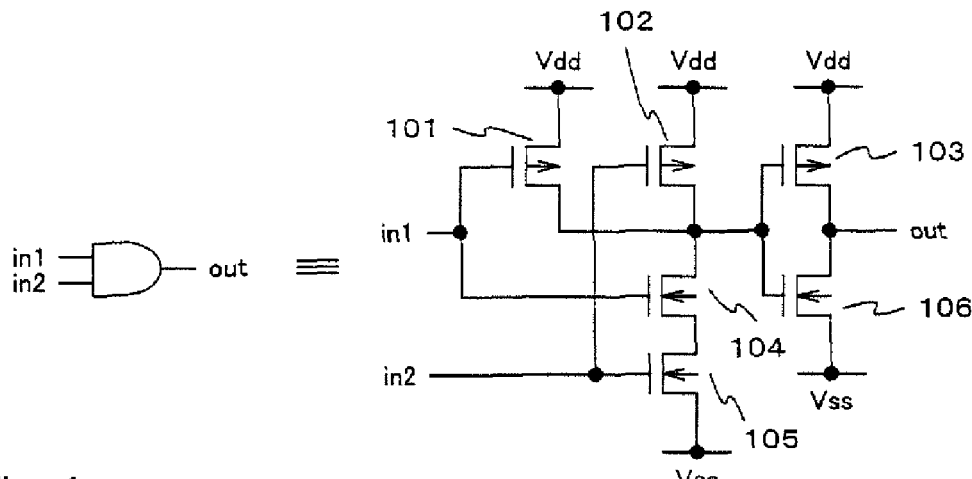
FIG. 4 shows an example of a circuit where the AND is structured by a MOS transistor.
Figure 8:
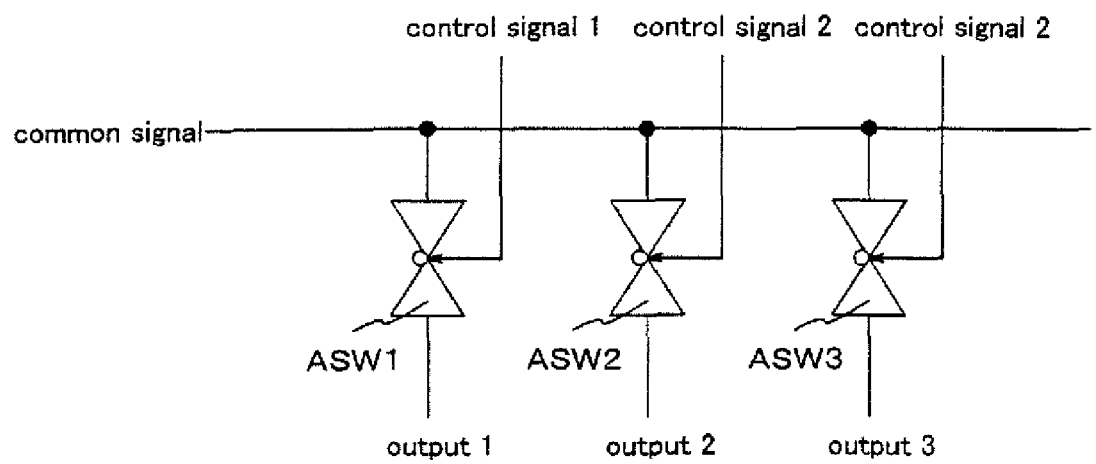
FIG. 8 shows an example of a circuit with the same function as FIG. 3, structured by using an analog switch.

FIG. 8 shows an example of a circuit having the same functions as an AND in FIG. 3 using an analog switch (shown as ASW). The analog switch is provided with a control terminal and an input terminal and output terminal in which a voltage applied to the control terminal determines the continuity or discontinuity. The control terminal is input with a control signal. A common signal is input one of the input terminal and the output terminal.

Figure 9:
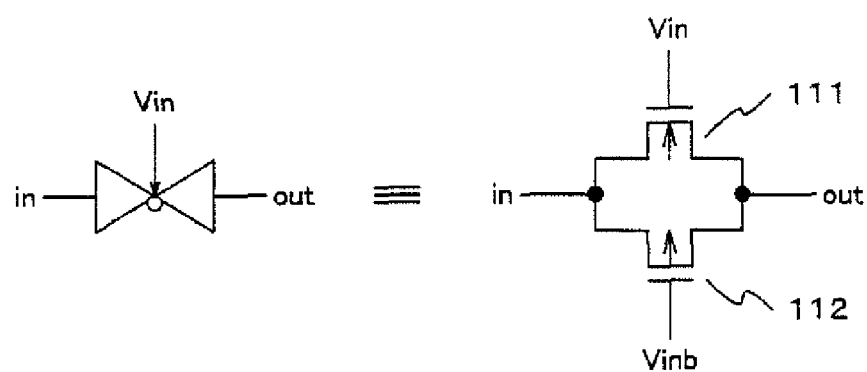
FIG. 9 shows an example of a circuit where the analog switch is structured by the MOS transistor.

FIG. 9 shows an example of a circuit structuring the analog switch using a MOS transistor. Here, a capability balance is made by combining an n-channel MOS transistor 111 and a p-channel MOS transistor 112. Of course, the analog switch may function with only the n-channel MOS transistor or only the p-channel transistor. Further, Vinb and Vin are opposite phase signals and are always output at an opposite phase logic level.

Figure 5:
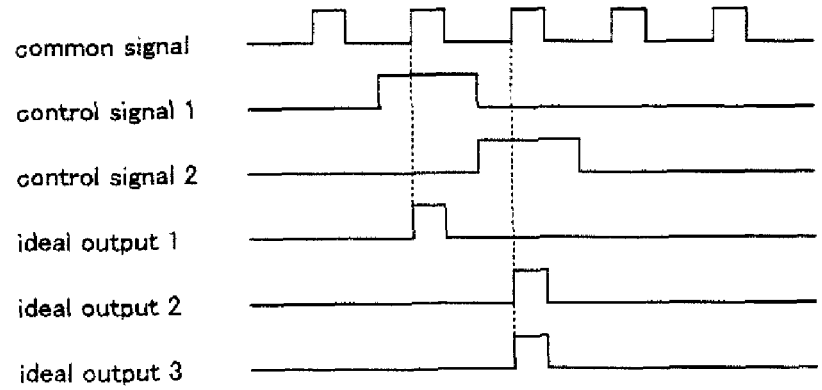
FIG. 5 shows an ideal timing chart of input output signals.
Figure 6:
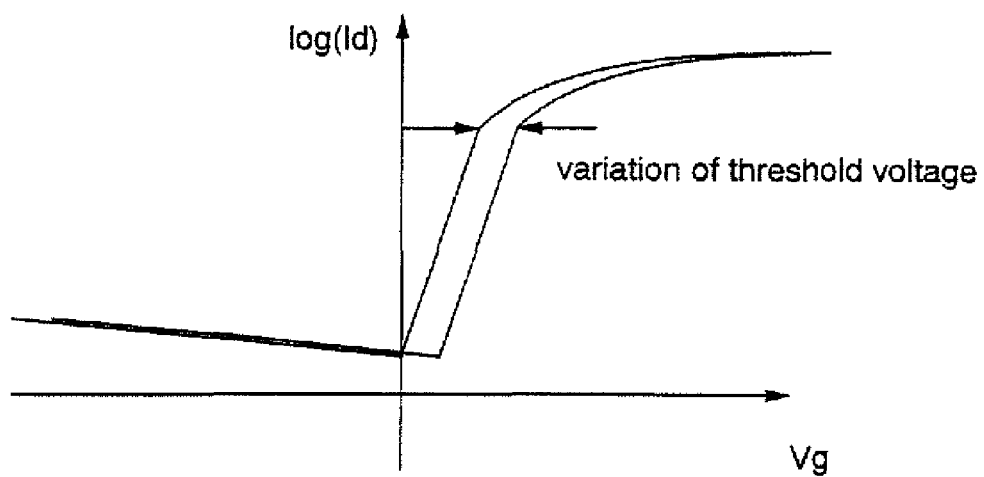
FIG. 6 shows a static characteristic of the MOS transistor with a variation in threshold.
Figure 7:
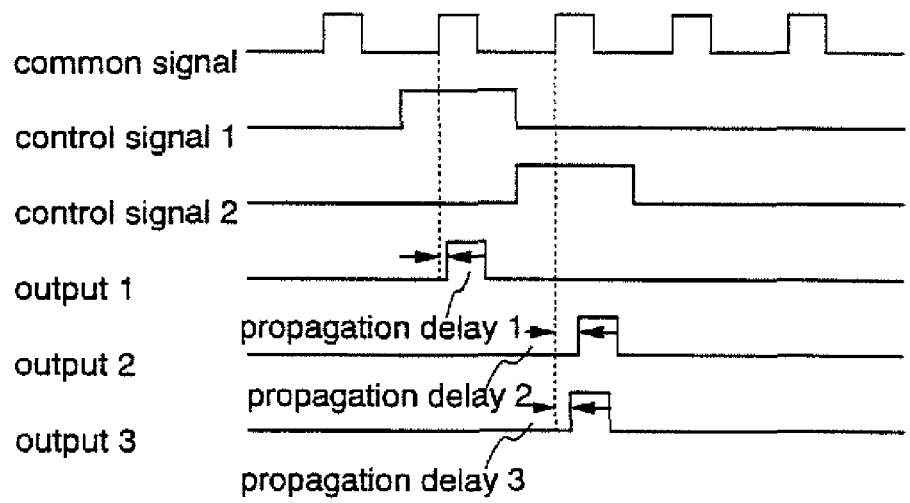
FIG. 7 shows a timing chart of input output signals with propagation delay.

Further, even if the signal of FIG. 5 is input to the circuit shown in FIG. 8, the same results as in the case of AND is obtained. From the example of the circuit shown in FIG. 9, the common signal is input to an input output electrode of the MOS transistor, and the control signal is input to a control electrode (gate terminal) of the MOS transistor. Of the input signal of FIG. 5, first the transistor is turned to an ON state by the control signal, and then the common signal is input.

That is, the transistor is not turned ON by the common signal, but the common signal is in continuity when the transistor is in an ON state, so that the transistor functions as a resistor in respect to the common signal, and is not easily influenced by a variation of the transistor. As a result, the variation in the output signal is reduced compared with a case where the AND is used.

EMBODIMENTS

Embodiment 1

Recently, a technique for manufacturing a thin film transistor (TFT) by forming a semiconductor thin film on a glass substrate is rapidly developing. Among the thin film transistors, particularly a polycrystalline silicon thin film transistor (poly-Si TFT) may be operated at higher speed compared to an amorphous thin film transistor. Therefore, in a semiconductor display device using the polycrystalline silicon thin film transistor, different from the case where the amorphous thin film transistor is used, a driver circuit may be directly formed on the same substrate as a pixel portion.

Figure 10:
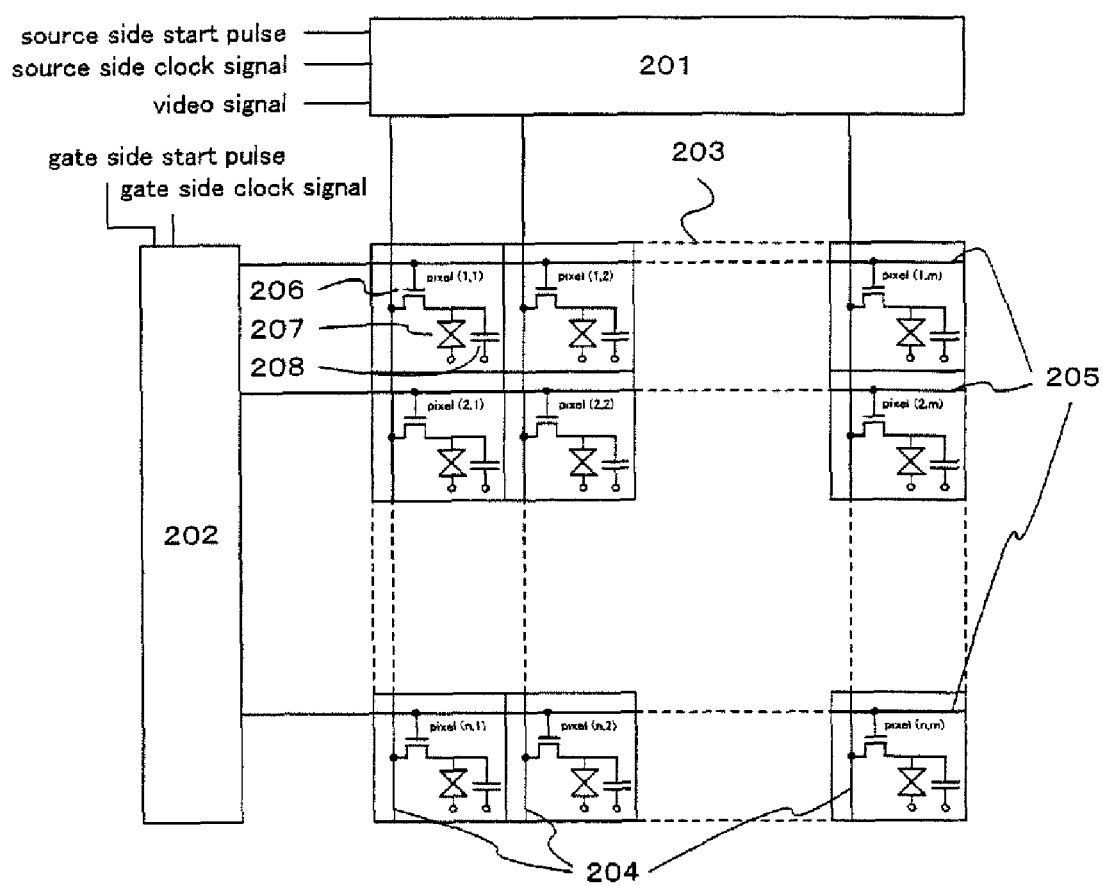
FIG. 10 shows an example of an active matrix liquid crystal display device with a driver circuit directly formed on the same substrate as a pixel portion.

In an active matrix liquid crystal display device in which a driver circuit is directly formed on the same substrate as a pixel portion, an example where the present invention is applied to the driver circuit which is driven in a dot-sequential analog method is shown. FIG. 10 shows a schematic view of one example.

A circuit diagram of the active matrix liquid crystal display device shown in FIG. 10 has a source side driver circuit 201, a gate side driver circuit 202 and a pixel portion 203. In the pixel portion 203, a source signal line 204 connected to the source side driver circuit 201, and a gate signal line 205 connected to the gate side driver circuit 202 intersect. In the region provided (surrounded) with the source signal line 204 and the gate signal line 205, there are provided a thin film transistor (pixel TFT) 206 of a pixel, a liquid crystal cell 207 sandwiching a liquid crystal between an opposing electrode and a pixel electrode and a storage capacitor 208.

An analog video signal output from the source side driver circuit 201 to the source signal line 204 (an analog video signal with image information) is selected by the pixel TFT 206, and written in a pixel electrode of the predetermined pixel. The pixel TFT 206 operates by the selected signal input from the gate side driver circuit 202 through the gate signal line 205.

The circuit diagram of the active matrix liquid crystal display device shown in FIG. 10 has m×n pixels in the pixel portion 203. Namely, m source signal lines 204 and n gate signal lines 205 are necessary.

Figure 11:
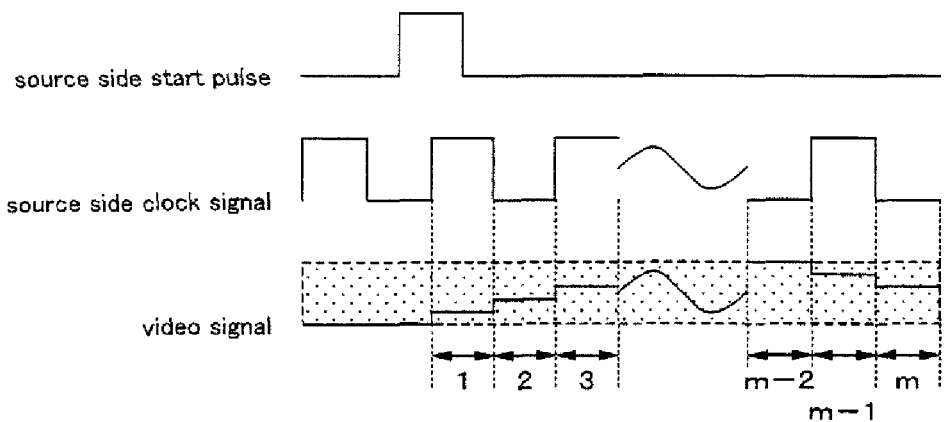
FIG. 11 shows a signal to be input to a source side driver circuit.

The source side driver circuit 201 is input with a source side start pulse, a source side clock signal and a video signal, and the relationship of those is shown in FIG. 11. The start pulse shows the timing when the video signal starts, and the video signal transmits the image information for one pixel in the half cycle period of the clock. The information of the pixel in the first row to the pixel in the mth row sequentially aligns in the video signal.

Figure 12:
FIG. 12 shows an example of the source side driver circuit.
Figure 12:
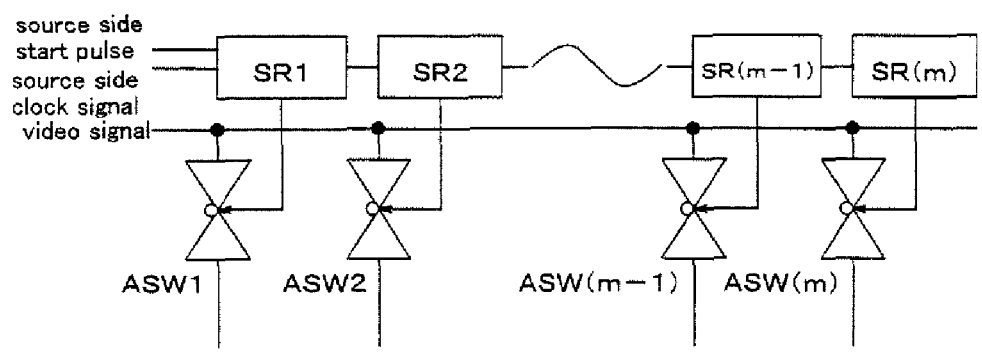
Figure 13:
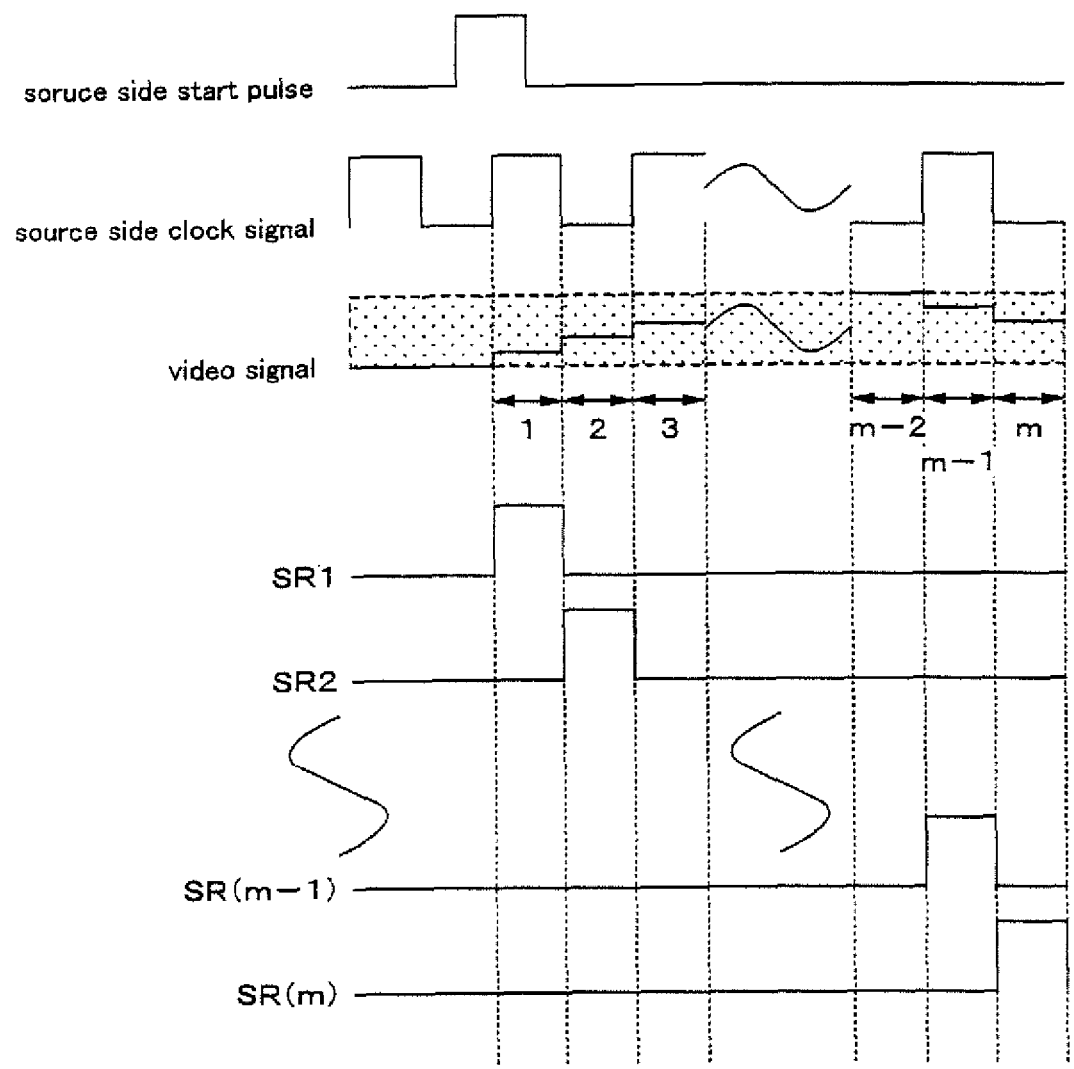
FIG. 13 shows the relationship of a signal to be input to the source side driver circuit and an output of a shift register.

In each pixel, to transmit image information of the video signal, the source side driver circuit 201 is structured as shown in FIG. 12. SR1, SR2, ..., SR (m−1), and SR (m) are shift registers, and the state of the shift register immediately before is transmitted by the timing of the rise time of the clock and the fall time of the clock. FIG. 13 shows the output of SR1, SR2, ..., SR (m−1), and SR (m).

The signals of the shift registers (sampling signals) are sent to the analog switches ASW1, ASW2, ..., ASW (m−1) and ASW (m), and video signals are sent to the source signal line 204 at an appropriate timing.

Here, the source side clock signal refers to the "common signal" used in this specification. It is desirable that the variation in the output signal (sampling signal) of the shift register is suppressed as much as possible. This is because, when the timing in which the video signal is transmitted to the source signal line 204 varies, there is a possibility that an imaging failure, such as writing in a signal to be written to the next pixel, occurs.

Figure 14:
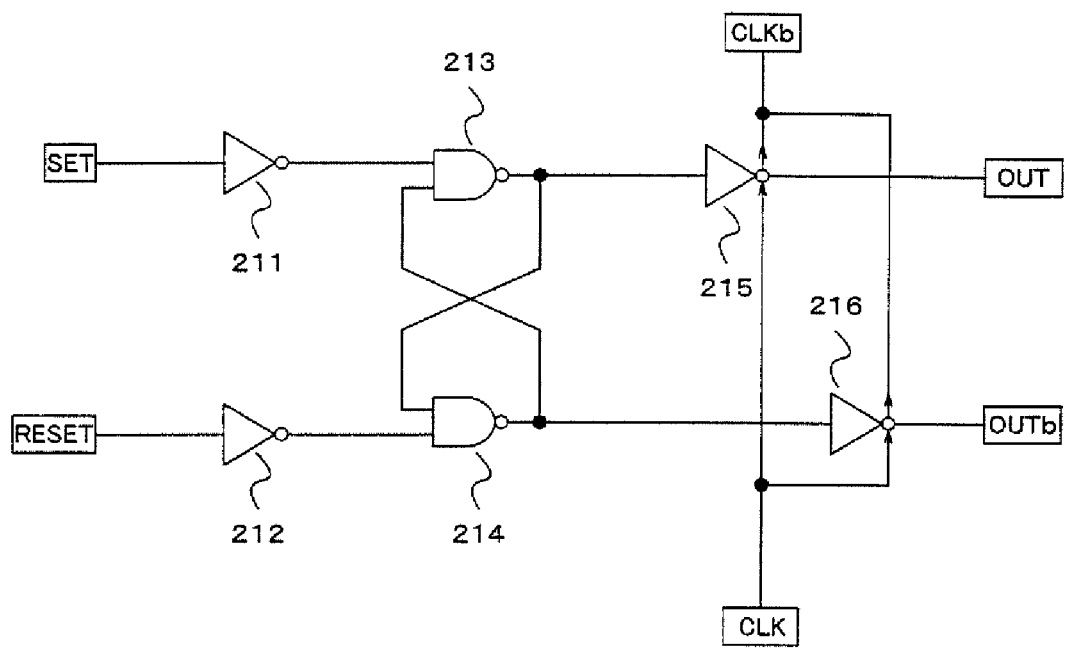
FIG. 14 shows an example of a circuit of a conventional shift register.
Figure 15:
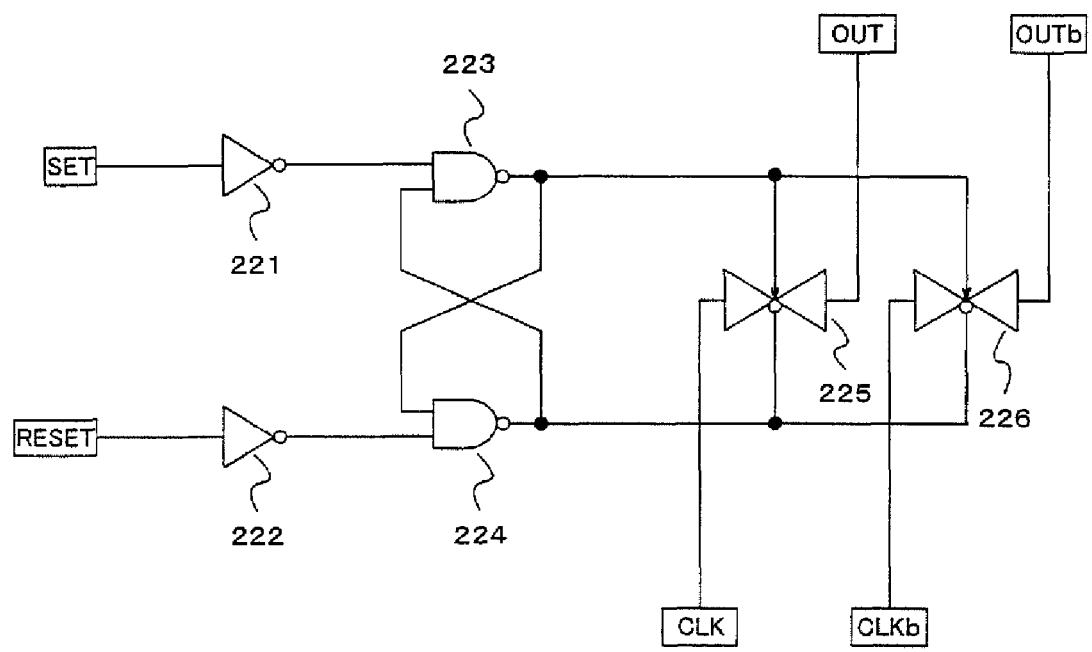
FIG. 15 shows an example of a circuit of a shift register using the present invention.

FIG. 14 shows an example of a conventional shift register circuit, and FIG. 15 shows an example of a shift register circuit using the present invention. FIGS. 14 and 15 are examples of using an RS (set reset) flip flop as a shift register, and have the four input terminals SET, RESET, CLK (clock) for synchronization, and CLKb which has an opposite phase of CLK. Further, the shift register circuit has as output terminals OUT and OUTb, where OUTb outputs an inverted signal of OUT. The output terminal OUT is connected to a SET terminal of a shift register in the next stage, and a control terminal of the analog switch connected to the source signal line 204 and a video signal, and the OUTb is connected to the RESET terminal of the shift register of the next level.

Figure 16:
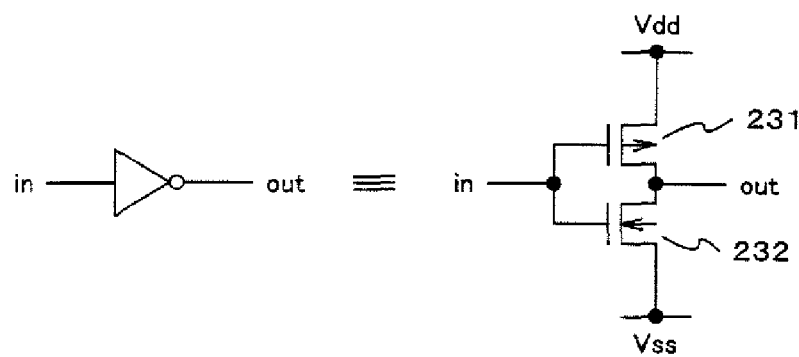
FIG. 16 shows an example of a circuit of an inverter.
Figure 17:
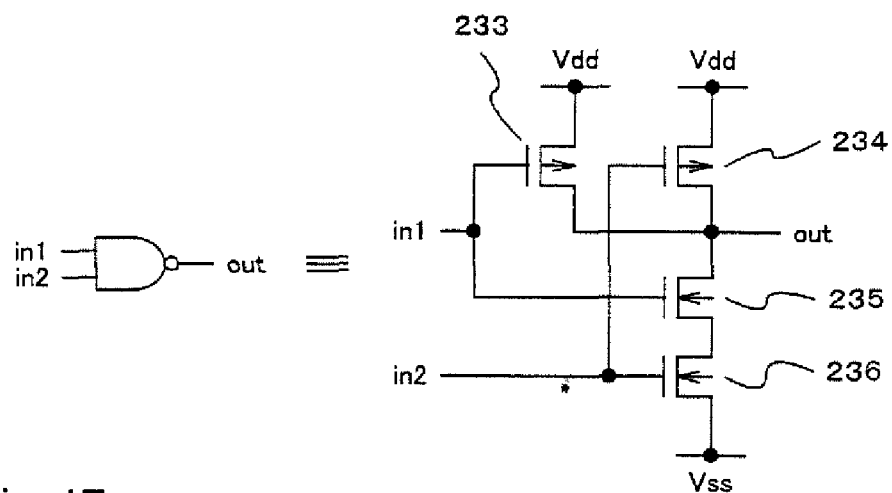
FIG. 17 shows an example of a circuit of a NAND.

FIG. 14 shows the RS flip-flop structured by an inverter 211, an inverter 212, a NAND 213 and a NAND 214. FIG. 15 shows the RS flip-flop structured by an inverter 221, an inverter 222, a NAND 223 and a NAND 214. FIG. 16 shows the structure of the inverter and FIG. 17 shows the structure of the NAND.

The inverter shown in FIG. 16 is formed of a p-channel TFT 231 and an n-channel TFT 232, and outputs by inverting the input signal. The NAND shown in FIG. 17 is comprised of a p-channel TFT 233, a p-channel TFT 234, an n-channel TFT 235 and an n-channel TFT 236. Only in the case that Hi is input to the two input terminals, Low is output.

In the RS flip-flop of FIGS. 14 and 15, when the SET signal becomes Hi, from that moment the output potential of the NAND 213 (reference numeral 223 in FIG. 15) becomes Hi, and such a state is maintained until the moment the RESET signal becomes Hi.

Figure 18:
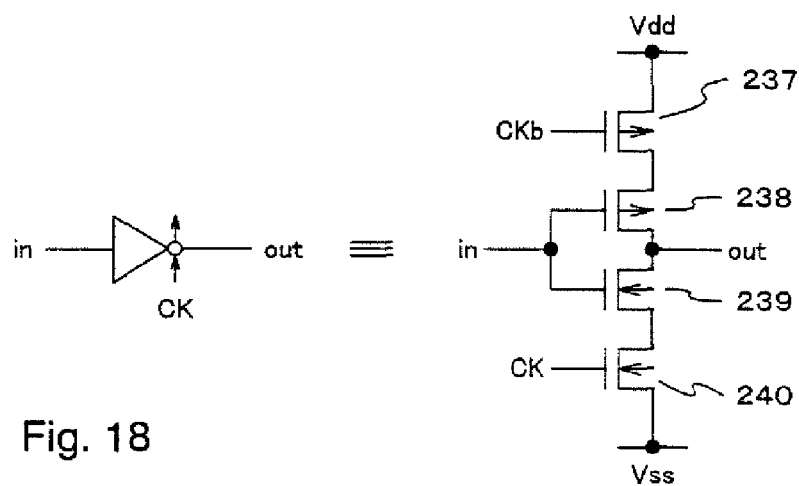
FIG. 18 shows an example of a circuit of a clocked inverter.

FIG. 14 shows the example of the conventional circuit of the shift register, where a clocked inverter 215 and a clocked inverter 216 output the information of RS flip-flop in synchronization with the clock. FIG. 18 shows the structure of the clocked inverter. The clocked inverter is comprised of a p-channel TFT 237, a p-channel TFT 238, an n-channel TFT 239 and an n-channel TFT 240, and when CK is Hi and the inverted signal CKb of CK is Low, it operates as an inverter.

FIG. 15 shows the example of the circuit of the shift register of the present invention, where the signal synchronized with the clock is output using an analog switch 225 and an analog switch 226. In this example, a signal with small variation may be output by changing a conventional clocked inverter to the analog switch.

Figure 19:
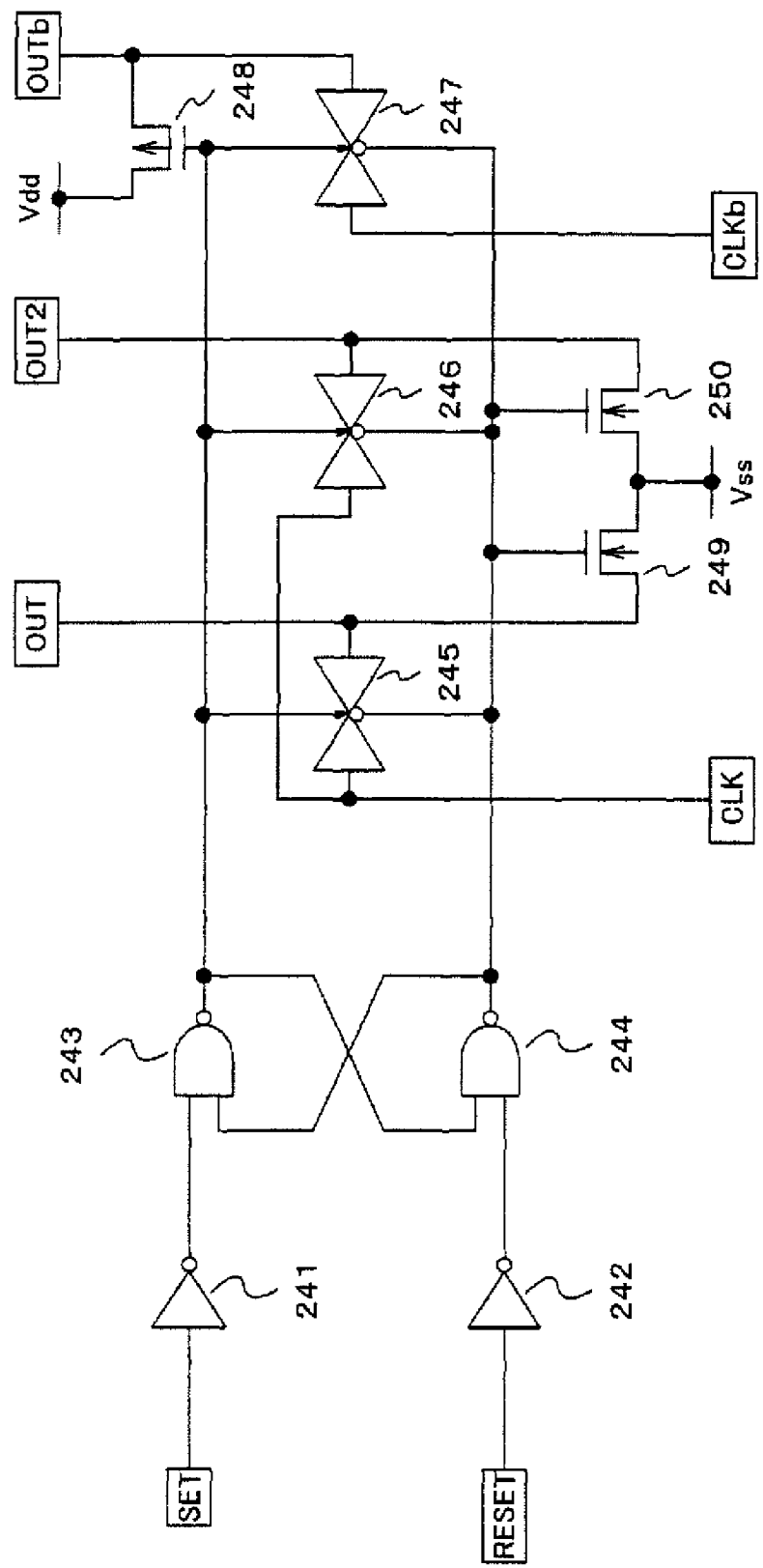
FIG. 19 shows a second example of a circuit of the shift register using the present invention.

Note that, in order to easily understand the circuit structure in FIG. 15, the circuit is illustrated with only a minimal necessary structure, but in actuality it may be shown as in FIG. 19. That is, in the electric circuit shown in FIG. 19, comparing with the analog switch shown in FIG. 15, an output terminal OUT2 is formed by additionally providing an analog switch 246, and the OUT which outputs to the SET terminal of the shift register of the next stage and the OUT2 which outputs to the control terminal of the analog switch which is connected to the video signal and the source signal line 204 are separated from each other. Further, to ensure the logic operation, an n-channel TFT 249, an n-channel TFT 250 and a p-channel TFT 248 are provided.

Up to here is the process of dividing the video signal by the source side driver circuit 201, and writing the divided video signals in the respective source signal lines 204. During this time, the gate side driver circuit 202 has selected one row of the gate signal line 205, the pixel TFT 206 of such row is turned ON, and the signal of the source signal line 204 is written into the liquid crystal cell 207 and the storage capacitor 208. The gate side driver circuit 202 needs to sequentially select the gate signal line 205, so similar to the source side driver circuit 201, the shift register is used to amplify the output of the shift register and to output to the gate signal line 205.

As in the above, the gate signal lines 205 are selected one by one. When all the gate signal lines are selected, one picture is formed.

Embodiment 2

The present invention may be used for various semiconductor display devices. In particular, the present invention may be used in an active matrix liquid crystal display device, an active matrix EL display device (light emitting device), and an active matrix EC display device. That is, the present invention may be applied to all electric equipment combining the semiconductor device as a display medium.

As such electronic equipment, there are a video camera, a digital camera, a projector (rear type or front type), a head mount display (goggle type display), a game machine, a car navigation system, a personal computer, a portable information terminal (a mobile computer, a portable telephone, an electronic book or the like). Examples of those are shown in FIGS. 20A to 22C.

Figure 20A:
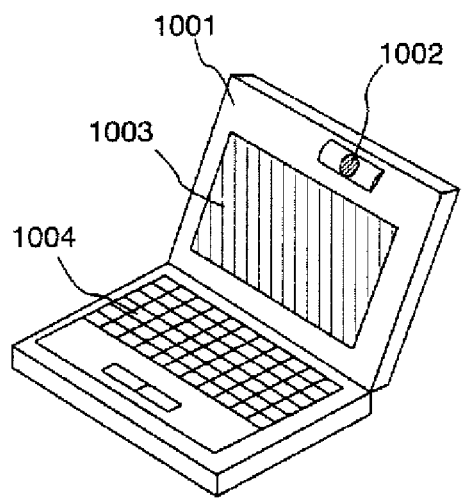
FIGS. 20A to 20E show examples of recent electronic equipment.

FIG. 20A shows a personal computer which is structured by a main body 1001, an image input portion 1002, a display device 1003 and a keyboard 1004. The present invention may be applied to the display device 1003 and other circuits.

Note that, in this embodiment, other circuits refer to a register or the like which is a memory circuit that temporarily stores memory and digital data used as a storage medium. The register is a circuit which functions like a memo in the digital circuit.

Figure 20B:
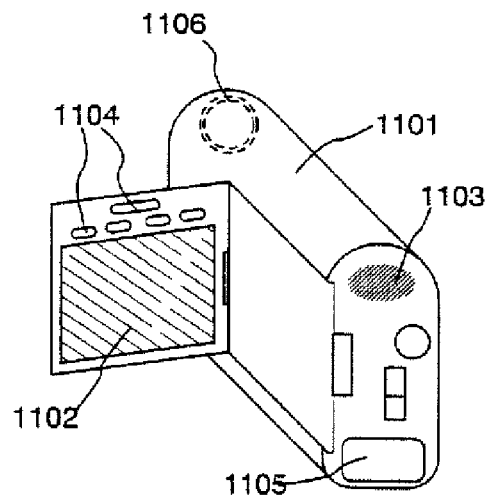

FIG. 20B shows a video camera which is structured by a main body 1101, a display device 1102, a voice input portion 1103, operating switches 1104, a battery 1105 and an image receiving portion 1106. The present invention may be applied to the display device 1102 and other circuits.

Figure 20C:
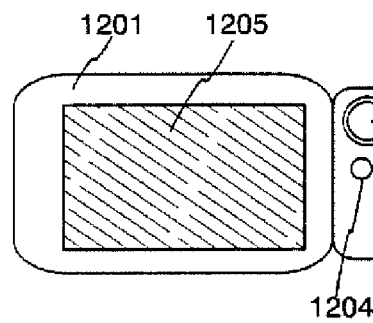

FIG. 20C shows a mobile computer which is structured by a main body 1201, a camera portion 1202, an image receiving portion 1203, an operating switch 1204 and a display device 1205. The present invention may be applied to the display device 1205 and other circuits.

Figure 20D:
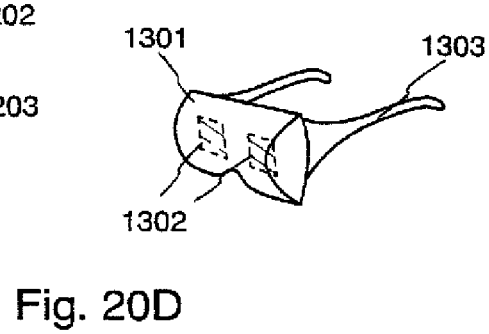

FIG. 20D shows a goggle type display which is structured by a main body 1301, a display device 1302 and an arm portion 1303. The present invention may be applied to the display device 1302 and other circuits.

Figure 20E:
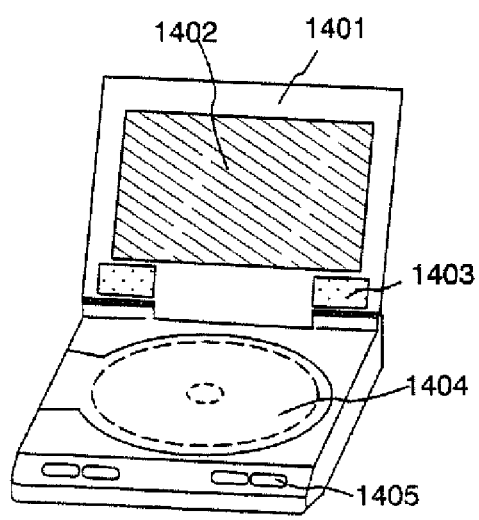

FIG. 20E shows a player using a recording medium (hereafter referred to as recording medium) recorded with a program which is structured by a main body 1401, a display device 1402, speaker portions 1403, a recording medium 1404 and operating switches 1405. Note that, this device uses a DVD (digital versatile disc), CD or the like as a recording medium, and may be used to listen to music, to see a movie, to play games and to use the Internet. The present invention may be applied to the display device 1402 and other circuits.

Figure 21A:
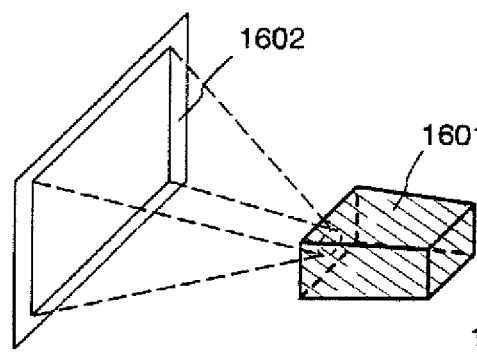
FIGS. 21A to 21D show projectors (three-plate system)

FIG. 21A is a front type projector which is structured by a light source optical system and a display device 1601, and a screen 1602. The present invention may be applied to the display device 1601 and other circuits.

Figure 21B:
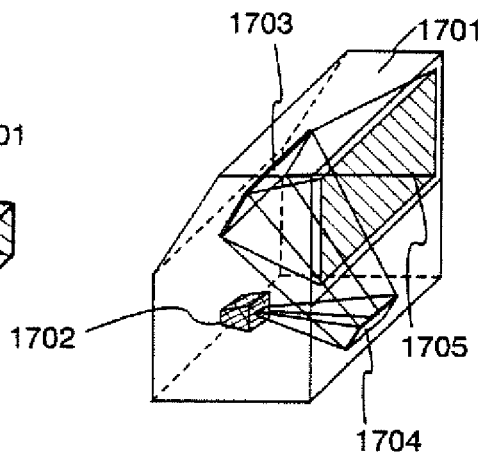

FIG. 21B is a rear type projector which is structured by a main body 1701, a light source optical system and a display device 1702, a mirror 1703, a mirror 1704 and a screen 1705. The present invention may be applied to the display device 1702 and other circuits.

Figure 21C:
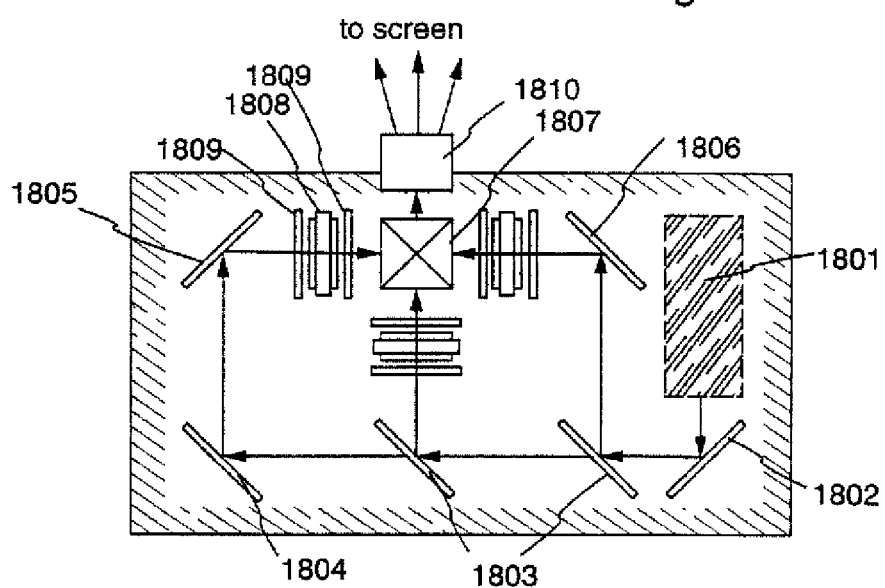

Note that, FIG. 21C is a diagram showing an example of a structure of the light source optical system and the display device 1601 or 1702 in FIG. 21A or 21B. The light source optical system and the display device 1601, 1702 are structured by a light source optical system 1801, mirrors 1802, 1804 to 1806, a dichroic mirror 1803, an optical system 1807, a display device 1808, a phase difference plate 1809 and a projection optical system 1810. The projection optical system 1810 is structured by a plurality of optical lenses provided with a projection lens. This structure is referred to as a three-plate system since it uses three display devices 1808. Further, the operator may provide in the optical path shown by an arrow in FIG. 21C, an optical lens, a film having polarizing functions, a film for adjusting the phase difference, an IR film and the like.

Figure 21D:
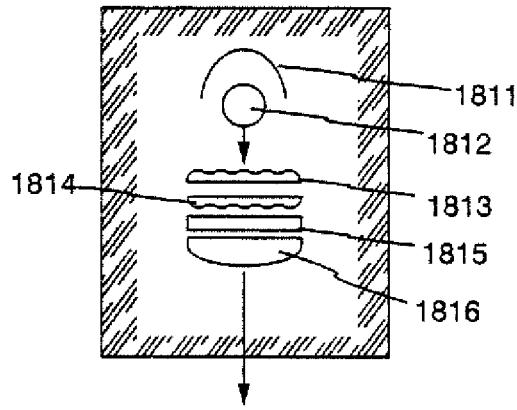

Further, FIG. 21D shows a diagram showing an example of a structure of the light source optical system 1801 in FIG. 21C. In this embodiment, the light source optical system 1801 is structured by a reflector 1811, a light source 1812, lens arrays 1813 and 1814, a polarizing conversion element 1815 and a condenser lens 1816. Note that, the light source optical system shown in FIG. 21D is one example, and it is not limited to this structure. For example, the operator may appropriately provide a light source lens, a film having polarizing functions, a film for adjusting the phase difference, an IR film and the like.

Figure 22A:
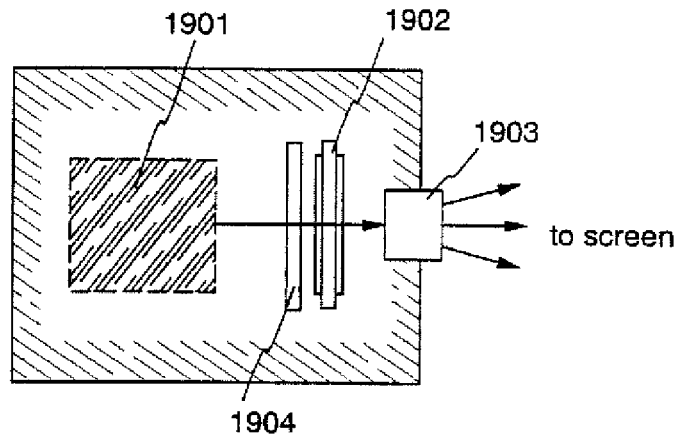
FIGS. 22A to 22C show projectors (single-plate system).

FIG. 21C shows an example of a three-plate system, and FIG. 22A is a diagram showing an example of a single-plate system. The light source optical system and the display device shown in FIG. 22A is structured by a light source optical system 1901, a display device 1902, a projection optical system 1903 and a phase difference plate 1904. The projection optical system 1903 is structured by a plurality of optical lenses with a projection lens. The light source optical system and the display device shown in FIG. 22A may be applied to the light source optical systems and the display devices 1601, 1702 in FIGS. 21A and 21B. Further, the light source optical system 1901 may use the light source optical system shown in FIG. 21D. Note that, the display device 1902 is provided with a color filter (not shown), and displays images in color.

Figure 22B:
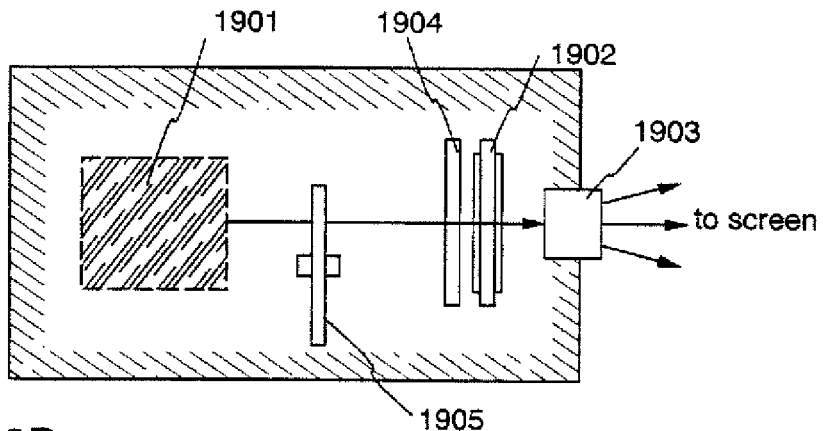

Further, the light source optical system and the display device shown in FIG. 22B is an applied example of FIG. 22A, and instead of providing a color filter, a RGB rotating color filter disk 1905 is used to display images in color. The light source optical system and the display device shown in FIG. 22B may be applied to the light source optical systems and the display devices 1601, 1702 shown in FIGS. 21A and 21B.

Figure 22C:
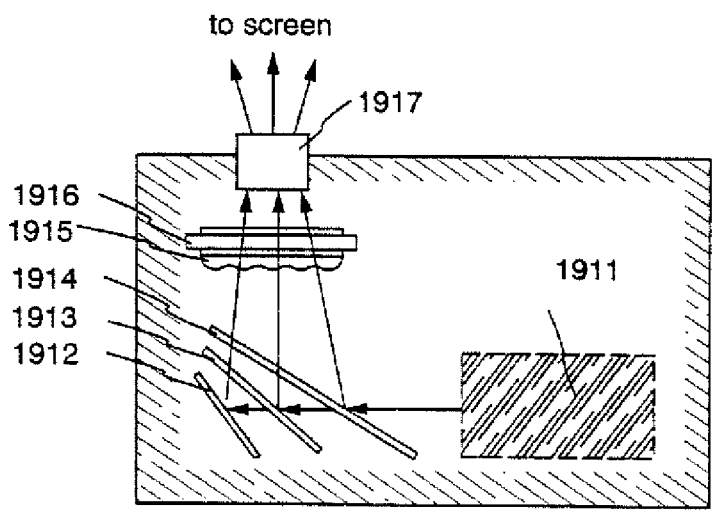

Further, the light source optical system and the display device shown in FIG. 22C is referred to as a color-filterless single-plate system. This system provides a micro lens array 1915 in the display device 1916 and displays a color image by using a dichroic mirror (green) 1912, a dichroic mirror (red) 1913 and a dichroic mirror (blue) 1914. A projection optical system 1917 is structured by a plurality of optical lenses provided with projection lenses. The light source optical system and the display device shown in FIG. 22C may be applied to the light source optical systems and the display devices 1601, 1702 shown in FIGS. 21A and 21B. Further, as a light source optical system 1911, an optical system using a coupling lens and a collimator lens in addition to the light source may be used.

As described above, the application range of the present invention is extremely wide and the present invention may be applied to various fields of electronic equipment.

The structure of the present invention is simple, and may be applied to all semiconductor circuits to be operated with synchronization. Further, an effect of reducing the shift from the synchronized signal due to the variation of the semiconductor element may be expected.

Further, by inputting the synchronized signal into an analog switch structured by a semiconductor element, there is a merit in that the conventional buffer circuit structured by using a plurality of inverters becomes unnecessary.

What is claimed is:
1. An active matrix display device comprising:
  a pixel portion formed over a substrate, and comprising a first TFT; and
  a driver circuit formed over the substrate, and comprising a shift register comprising:

a flip-flop comprising a second TFT;
a first analog switch comprising a first control terminal electrically connected to the flip-flop, a first input terminal and a first output terminal; and
a second analog switch comprising a second control terminal electrically connected to the flip-flop, a second input terminal and a second output terminal;
wherein the first input terminal and the first output terminal have electrical continuity each other by applying a first signal to the first control terminal,
wherein the second input terminal and the second output terminal have electrical continuity each other by applying a second signal to the second control terminal, and
wherein an output of the shift register is an output of the first analog switch.

2. An active matrix display device according to claim 1, wherein the first signal and the second signal are always output at an opposite logic level.

3. An active matrix display device according to claim 1, wherein the flip-flop produces the first and second signals in response to one or more video signals.

4. An active matrix display device according to claim 1, wherein the first analog switch and the second analog switch comprise a MOS transistor or a MIS transistor.

5. An active matrix display device according to claim 1, wherein the first analog switch outputs a clock signal when applying the first signal to the first control terminal, and the second analog switch outputs a clock back signal when applying the second signal to the second control terminal.

6. An active matrix display device according to claim 1, wherein the first analog switch outputs a trigger signal when applying the first signal to the first control terminal, and the second analog switch outputs a trigger signal when applying the second signal to the second control terminal.

7. An active matrix display device according to claim 1,
wherein a first wiring is electrically connected to the first output terminal and a second flip flop in a next stage, and
wherein a second wiring is electrically connected to the first output terminal and a switch.

8. An active matrix display device comprising:
a pixel portion formed over a substrate, and comprising a first TFT; and
a driver circuit formed over the substrate, and comprising a shift register comprising:
a flip-flop comprising a second TFT;
a first analog switch comprising a first control terminal electrically connected to the flip-flop, a first input terminal and a first output terminal; and
a second analog switch comprising a second control terminal electrically connected to the flip-flop, a second input terminal and a second output terminal;
wherein the first input terminal and the first output terminal have electrical continuity each other by applying a first signal to the first control terminal,
wherein the second input terminal and the second output terminal have electrical continuity each other by applying a second signal to the second control terminal,
wherein the first analog switch and the second analog switch comprise transistors having a same conductivity, and
wherein an output of the shift register is an output of the first analog switch.

9. An active matrix display device according to claim 8, wherein the first signal and the second signal are always output at an opposite logic level.

10. An active matrix display device according to claim 8, wherein the flip-flop produces the first and second signals in response to one or more video signals.

11. An active matrix display device according to claim 8, wherein each of the first analog switch and the second analog switch comprises a MOS transistor or a MIS transistor.

12. An active matrix display device according to claim 8, wherein the first analog switch outputs a clock signal when applying the first signal to the first control terminal, and the second analog switch outputs a clock back signal when applying the second signal to the second control terminal.

13. An active matrix display device according to claim 8, wherein the first analog switch outputs a trigger signal when applying the first signal to the first control terminal, and the second analog switch outputs a trigger signal when applying the second signal to the second control terminal.

14. An active matrix display device according to claim 8,
wherein a first wiring is electrically connected to the first output terminal and a second flip flop in a next stage, and
wherein a second wiring is electrically connected to the first output terminal and a switch.

15. An active matrix display device comprising:
a pixel portion formed over a substrate, and comprising a first TFT; and
a driver circuit formed over the substrate, and comprising:
a shift register comprising:
a first analog switch comprising a first control terminal, a first input terminal and a first output terminal; and
a second analog switch comprising a second control terminal, a second input terminal and a second output terminal,
a third analog switch comprising a third control terminal electrically connected to the shift register, a third input terminal and a third output terminal and
a pixel in the pixel portion, electrically connected to the third analog switch,
wherein a first common signal is inputted to the first input terminal, and outputted from the first output terminal by applying a first signal to the first control terminal,
wherein a second common signal is inputted to the second input terminal, and outputted from the second output terminal by applying a second signal to the second control terminal, and
wherein the first common signal is inputted to the third control terminal, thereby a video signal is inputted to the pixel through the third input terminal and the third output terminal.

16. An active matrix display device according to claim 15, wherein the first signal and the second signal are always output at an opposite logic level.

17. An active matrix display device according to claim 15, wherein a flip-flop produces the first and second signals in response to one or more video signals.

18. An active matrix display device according to claim 15, wherein each of the first analog switch and the second analog switch comprises a MOS transistor or a MIS transistor.

19. An active matrix display device according to claim 15, wherein out of the first common signal and the second common signal, one is a clock signal, and the other is a clock back signal.

20. An active matrix display device according to claim 15, wherein the first common signal and the second common signal are trigger signals.

* * * * *